United States Patent [19]
Gardner et al.

[11] Patent Number: 5,953,613
[45] Date of Patent: Sep. 14, 1999

[54] HIGH PERFORMANCE MOSFET WITH A SOURCE REMOVED FROM THE SEMICONDUCTOR SUBSTRATE AND FABRICATION METHOD THEREOF

[75] Inventors: Mark I. Gardner, Cedar Creek; Frederick N. Hause, Austin, both of Tex.

[73] Assignee: Advanced Micro Devices, Inc., Sunnyvale, Calif.

[21] Appl. No.: 08/811,415

[22] Filed: Mar. 4, 1997

[51] Int. Cl.$^6$ .................................................. H01L 21/336
[52] U.S. Cl. ........................ 438/301; 438/185; 438/305; 438/306
[58] Field of Search ..................................... 438/301, 152, 438/153, 300, 163, 185, 231, 286, 305, 306

[56] References Cited

U.S. PATENT DOCUMENTS

| | | |
|---|---|---|
| 5,747,367 | 5/1998 | Kadosh et al. . |
| 5,747,373 | 5/1998 | Yu . |
| 5,770,482 | 6/1998 | Kadosh et al. . |
| 5,783,458 | 7/1998 | Kadosh et al. . |

*Primary Examiner*—John F. Niebling
*Assistant Examiner*—Jonathan Hack
*Attorney, Agent, or Firm*—Skjerven, Morrill, MacPherson, Franklin & Friel LLP; Ken J. Koestner

[57] ABSTRACT

The ultimate shallow source drain junction depth for a transistor is achieved by removing or detaching a source from the semiconductor substrate and forming an electron source on the surface of the semiconductor substrate adjacent to the transistor gate. The removal or detachment of an electron source from the semiconductor substrate eliminates the heavily-doped source drain diffusion or implant into a source region of the substrate, thereby avoiding non-uniform doping profiles that degrade long-channel subthreshold characteristics of a device as well as the punchthrough behavior of short-channel devices. A metal plug is used as an electron source which is removed or detached from the from the semiconductor substrate. The metal plug is vastly superior to doped semiconductor materials as an electron source. A method of fabricating an integrated circuit includes forming a lightly-doped drain (LDD) MOSFET structure prior to source/drain doping. The MOSFET structure includes a gate formed on a substrate over a gate oxide layer, spacers formed on sides of the gate, LDD doping of the substrate in a source region and a drain region self-aligned with the gate, and drain doping in the drain region self-aligned with the gate and spacers. The method further includes forming an oxide layer over the substrate and LDD MOSFET structure, forming a polysilicon layer over the oxide layer, cutting a via through the polysilicon layer and source layer to the substrate surface adjacent to the gate and spacer and abutting the source region of the substrate, and forming a metal plug in the via, the metal plug electrically coupling to the LDD doping in the source region of the substrate and electrically coupling to the polysilicon layer, the metal plug serving as a source for the MOSFET.

24 Claims, 5 Drawing Sheets

HIGH PERFORMANCE MOSFET WITH A SOURCE REMOVED FROM THE SEMICONDUCTOR SUBSTRATE AND FABRICATION METHOD THEREOF

BACKGROUND OF THE INVENTION

1. Field of the Invention

The present invention relates to an integrated circuit and fabrication method. More specifically, the present invention relates to an integrated circuit including a MOSFET having a very shallow source-drain junction by virtue of removal of the source from the substrate.

2. Description of the Related Art

In Metal Oxide Semiconductor (MOS) integrated circuit applications, transistor performance is highly dependent on many factors including the concentration of dopant atoms at different depths in the substrate wafer, the concentration of dopant atoms at the wafer surface, and the ability to set and maintain a uniform and stable threshold voltage $V_T$. Transistor performance is greatly improved when the dopant concentration is consolidated at the wafer surface. Accordingly, achieving a very shallow source drain junction greatly supports improved transistor performance.

The formation of a very shallow source drain junction is also very important form maintaining a uniform and stable threshold voltage $V_T$. One technique for controlling threshold voltage $V_T$ is implantation of dopants to either increase or decrease the net dopant concentration at the surface of a silicon wafer. By selection of these dopants, the threshold voltage $V_T$ is selected on the basis of device performance alone. A $V_T$-adjustment implant technique involves depositing and etching a threshold mask, then implanting boron, phosphorus or arsenic ions directly into the substrate or through a thin oxide layer to the regions under the gate oxide of a MOSFET. Boron implantation produces a positive shift in threshold voltage $V_T$. Phosphorus or arsenic implantation causes a negative shift. The $V_T$-adjust implant is often performed through an oxide layer with the implant energy selected to place the peak of the implant slightly below the oxide-silicon interface. Following an implant-activating anneal process, the implanted distribution is broadened.

One problem with the $V_T$-adjust implant is that the dopant profile in a device channel underlying a gate is nonuniform due to the introduction of extra ions into the channel depletion region of the device. The additional dopant ions cause the width of the channel depletion region to be modified. The non-uniform doping profile changes long-channel subthreshold characteristics of the device as well as the punchthrough behavior of short-channel devices.

Another problem with the $V_T$-adjust implant is that the depth at which ions are implanted is difficult to control so that shallow depths are difficult to achieve. A shallow implant is difficult to achieve using the $V_T$-adjust implant due to limitations on energy of an implant device. For example, boron molecules are very small so that even a minimal implant energy drives the boron molecules an unsuitable depth into the substrate. $BF_2$ molecules are larger and therefore more easily implanted to a more shallow depth although further limitations on implant depth are desired. Increasing implant depth disadvantageously creates channeling effects, creates lattice damage, and increases the voltage drop between the implant and the substrate surface.

What is needed is a technique for concentrating dopant atoms at the surface of a semiconductor wafer. What is further needed is a technique for achieving a very shallow source drain junction.

SUMMARY

It has been discovered that the ultimate shallow source drain junction depth for a transistor is achieved by removing or detaching a source from the semiconductor substrate and forming an electron source on the surface of the semiconductor substrate adjacent to the transistor gate.

In accordance with an aspect of the present invention, the removal or detachment of an electron source from the semiconductor substrate eliminates the heavily-doped source drain diffusion or implant into a source region of the substrate, thereby avoiding non-uniform doping profiles that degrade short-channel subthreshold characteristics of a device as well as the punchthrough behavior of short-channel devices.

In accordance with a further aspect of the present invention, a metal plug is used as an electron source which is removed or detached from the from the semiconductor substrate. The metal plug is vastly superior to doped semiconductor materials as an electron source.

In accordance with an aspect of some embodiments of the present invention, a conventional LDD process flow for forming a MOSFET on a substrate is minimally modified, first by only implanting a drain region and not the source during a source drain implant, second by forming silicon nitride spacers on the sides of a gate electrode, and third by supplying an electron source in the form of a metal plug adjacent to the spacer on the side of the gate electrode and abutting the substrate.

In accordance with an embodiment of the present invention, a method of fabricating an integrated circuit includes forming a lightly-doped drain (LDD) MOSFET structure prior to source/drain doping. The MOSFET structure includes a gate formed on a substrate over a gate oxide layer, spacers formed on sides of the gate, LDD doping of the substrate in a source region and a drain region self-aligned with the gate, and drain doping in the drain region self-aligned with the gate and spacers. The method further includes forming an oxide layer over the substrate and LDD MOSFET structure, forming a polysilicon layer over the oxide layer, cutting a via through the polysilicon layer and source layer to the substrate surface adjacent to the gate and spacer and abutting the source region of the substrate, and forming a metal plug in the via, the metal plug electrically coupling to the LDD doping in the source region of the substrate and electrically coupling to the polysilicon layer, the metal plug serving as a source for the MOSFET.

In accordance with an embodiment of the present invention, an integrated circuit includes a lightly-doped drain (LDD) MOSFET structure prior to source/drain doping. The LDD MOSFET structure prior to source/drain doping includes a gate formed on a substrate over a gate oxide layer, spacers formed on sides of the gate, LDD doping of the substrate in a source region and a drain region self-aligned with the gate, and drain doping in the drain region self-aligned with the gate and spacers. The integrated circuit further includes an oxide layer over the substrate and LDD MOSFET structure, a polysilicon layer over the oxide layer, a via intersecting the polysilicon layer and source layer and extending to the substrate surface adjacent to the gate and spacer and abutting the source region of the substrate, and a metal plug in the via, the metal plug electrically coupling to the LDD doping in the source region of the substrate and electrically coupling to the polysilicon layer, the metal plug serving as a source for the MOSFET.

Many advantages are achieved by the described integrated circuit and fabrication method. It is highly advantageous that the resulting source drain junction attains the ultimate shallow structure at a position on the substrate surface. It is advantageous that heavily doped source drain diffusion into the silicon substrate is eliminated. It is advantageous that the fabricated MOSFET has a source in the form of a metal plug, greatly improving the conductive character of the source. It is advantageous that the electron source is supplied not only by a metal plug but also by a polysilicon layer overlying the wafer attaining a much higher conductivity and a much lower resistance. It is advantageous that a metal plug supplies a large concentration of electrons at the surface and a very shallow depth in the substrate.

The described integrated circuit and associated fabrication method advantageously achieves a shallower junction, a shorter junction, a greater concentration of source electrons and better conduction properties in comparison to conventional source drain implants. As the dimensions of transistors and devices are scaled to smaller levels, the described fabrication method scales down to a feature size on the order of a contact hole so that a large source of electrons is advantageously supplied in a compact, localized region.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings.

DETAILED DESCRIPTION OF THE ILLUSTRATIVE EMBODIMENTS

Figure 1A:
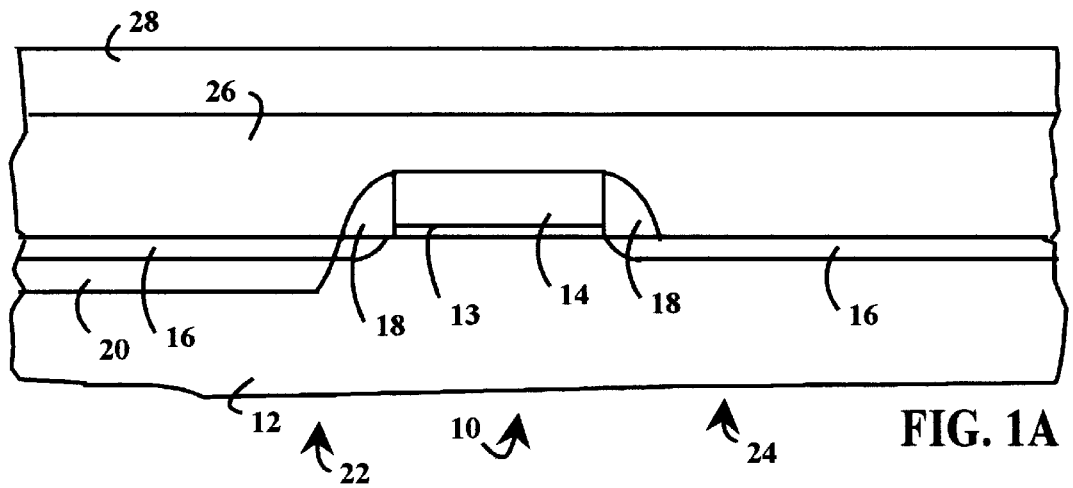
FIGS. 1A through 1C are a sequence of schematic cross-sectional views that depict a summary of the fabrication process for forming an integrated circuit including a MOSFET source that is removed or detached from the semiconductor substrate.
Figure 1B:
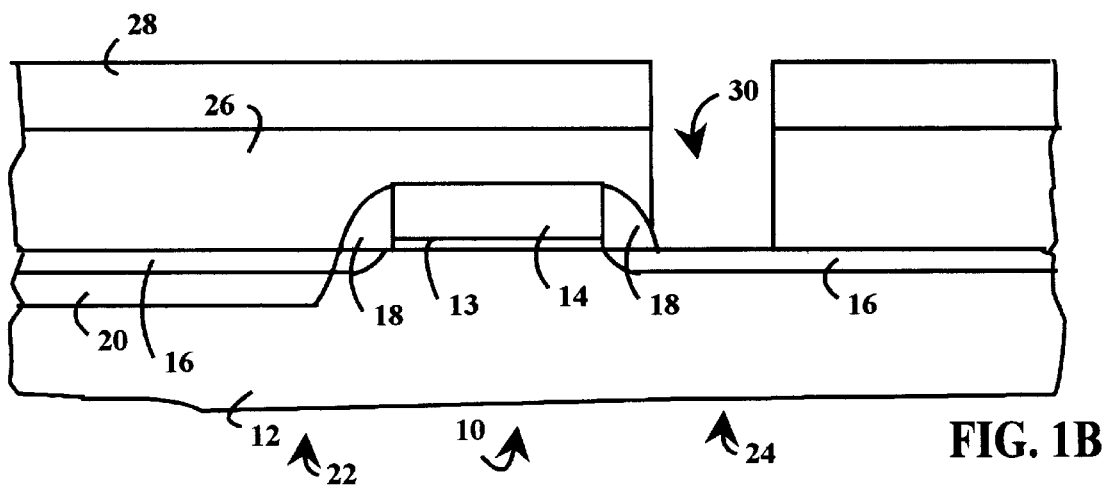
Figure 1C:
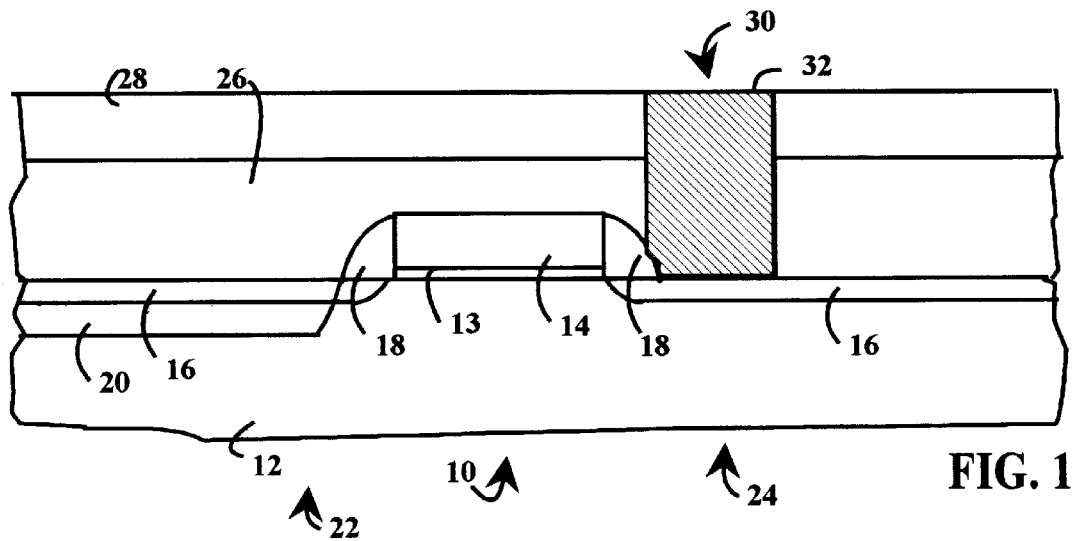

Referring to FIGS. 1A through 1C, a sequence of schematic cross-sectional views depict a summary of the fabrication process for forming an integrated circuit including a MOSFET source that is removed or detached from the semiconductor substrate.

FIG. 1A depicts a cross-sectional view of a MOSFET 10 formed on a substrate 12. In an illustrative embodiment, the MOSFET 10 is formed using lightly-doped drain (LDD) fabrication techniques including formation of a gate oxide layer 13 overlying the substrate 12, formation of a polysilicon gate 14, and implant of LDD regions 16 in the substrate 12 self-aligned with the polysilicon gate 14. Silicon nitride spacers 18 are formed lateral to the polysilicon gate 14. The spacers 18 are formed of silicon nitride because silicon nitride is resistant to silicon oxide etching processes. The spacers may be formed from materials other than silicon nitride. Advantages are gained for materials that are resistant to silicon oxide etching processes.

Following formation of the silicon nitride spacers 18, a heavily-doped drain implant 20 is implanted on a drain side 22 of the MOSFET 10. A source side 24 of the MOSFET 10 is not implanted with a heavily-doped source implant. A layer of silicon oxide 26 is deposited over the substrate 12 and the polysilicon gate 14 and silicon nitride spacers 18. A layer of polysilicon 28 is deposited over the layer of silicon oxide 26.

Referring to FIG. 1B, a source via 30 is cut through the layer of polysilicon 28 and the layer of silicon oxide 26 to the surface of the substrate 12 adjacent to the silicon nitride spacer 18 and abutting the LDD regions 16 on the source side 24 of the MOSFET 10.

Referring to FIG. 1C, a metal plug 32 is formed in the source via 30 making an ohmic connection to the LDD regions 16 on the source side 24 of the MOSFET 10. The metal plug 32 serves as a source for the MOSFET 10, supplying electrons from a highly conductive source region that is removed from the substrate 12. The metal plug 32 is electrically connected to the layer of polysilicon 28 which is made conductive by heavy doping and, in some embodiments, silicidation to further extend the removed electron source.

Figure 2A:
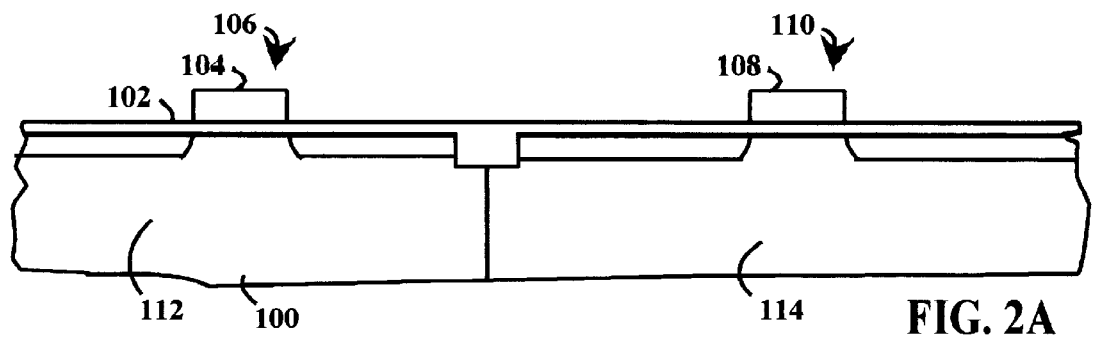
FIGS. 2A through 2G depict a sequence of schematic cross-sectional views of a silicon wafer during processing for forming an integrated circuit including formation of a MOSFET source that is detached or removed from the substrate.

FIGS. 2A through 2G show a series of schematic cross-sectional views of a silicon wafer 100 during processing for forming an integrated circuit including formation of a MOSFET source that is detached or removed from the substrate. Referring to FIG. 2A, an exemplary embodiment is shown in which NMOS devices in an N-well technology are formed in a lightly doped P-substrate having a P-type impurity concentration of greater than approximately $10^{15}/cm^3$ and PMOS devices are formed in a more heavily-doped N-type substrate having an impurity concentration of less than $10^{16}/cm^3$. The starting material is typically a heavily-doped <100> orientation silicon substrate having a quality suitable for integrated circuit manufacture. A thin (5 $\mu$m to 10 $\mu$m) lightly-doped epitaxial layer is grown on the silicon substrate. The illustrative epitaxial layer is a P-type epitaxial surface layer with a <100> orientation and a resistivity of 12 ohm-cm. Either an n-epi-on-n$^+$ or a p-epi-on-p$^+$ substrate may be used for the epitaxial layer. The a p-epi-on-p$^+$ substrate is more typically used due to a lesser sensitivity to process-induced defects. The silicon substrate and the epitaxial layer in combination form a silicon wafer 100.

Ions are implanted into the silicon wafer 100 to adjust a threshold voltage $V_T$. In embodiments including a P-layer, an N-layer, or both a P-layer and an N-layer, the threshold voltage $V_T$ is adjusted by ion implantation for both enhancement mode and depletion mode transistors. Ion implantation is used to set threshold voltage $V_T$, advantageously allowing the threshold voltage $V_T$ to be set independently of substrate doping, allowing substrate doping to be set on the basis of device performance alone. Adjustment of threshold voltage $V_T$ is achieved by implanting impurities such as boron, phosphorus, or arsenic ions into regions beneath the gate oxide of a MOSFET. Boron atoms positively shift threshold voltage $V_T$. Phosphorus or arsenic atoms negatively shift threshold voltage $V_T$. The threshold voltage $V_T$ adjustment implant is performed either with a single boron implant or separate p-type and n-type implants using additional masking steps.

In the illustrative embodiment, threshold adjustment implants and punchthrough implants are implanted prior to growth of a gate-oxide layer on the silicon wafer 100 surface. In various embodiments, threshold adjustment implants and punchthrough implants may be performed either before or after formation of a trench or before or after gate-oxide growth. In conventional devices, the threshold voltage $V_T$ adjustment implant is injected through the gate oxide layer to limit depth of the boron threshold adjustment implant to a shallow depth. A suitable threshold voltage $V_T$-adjust implant energy forms an implant with a peak concentration at the oxide-silicon interface. A subsequent implant-activating anneal operation distributes the implanted ions more broadly than the implanted profile.

In an illustrative embodiment, a threshold voltage $V_T$ adjustment implant for enhancement-mode devices is performed. For example, boron is implanted at a concentration in a range from approximately $10^{12}$ to $10^{13}$ atoms/cm$^2$ and an energy in the range from about 50 keV to 100 keV, an energy insufficient to penetrate a trench or field oxide isolation (not shown). The VT adjustment implant for enhancement-mode devices is typically performed without masking.

A threshold voltage $V_T$ adjustment implant for depletion-mode devices is performed by implanting areas of depletion-mode devices with phosphorus or arsenic atoms at a concentration of about $10^{12}$ atoms/cm$^2$ and an implant energy in the range of about 100 keV. The implant dosage is adjusted to overcompensate for the boron threshold voltage $V_T$ adjustment implant for enhancement-mode devices. The depletion-mode implant is performed with a photoresist mask to selectively locate the depletion-mode transistor channels.

A layer of silicon dioxide with a thickness in the range of 30 Å to 150 Å forms a gate oxide layer 102 on the top surface of the silicon wafer 100 by tube growth at a temperature of 700° C. to 1000° C. in an $O_2$ ambient.

In the illustrative embodiment, a polysilicon gate 104 for a P-channel transistor 106 and a polysilicon gate 108 for an N-channel transistor 110 are formed by depositing a layer of undoped polysilicon to a thickness of approximately 2000 Å by low pressure chemical vapor deposition (LPCVD) over the gate oxide layer 102. The polysilicon is doped using a technique selected from among several suitable techniques including doping in situ during deposition and doping prior to etching by implanting arsenic atoms with a dosage in a range from $1\times10^{15}$ to $5\times10^{16}$ atoms/cm$^2$ and an energy in a range from 2 to 50 kiloelectron-volts (keV). In another example, polysilicon is doped in a subsequent process step during introduction of dopant into the silicon wafer 100. The polysilicon gates 104 and 108 are formed by depositing a photoresist mask (not shown) in a continuous layer over the polysilicon layer and irradiating the photoresist mask using a photolithographic system. The photolithographic system projects I-line ultraviolet light from a mercury-vapor lamp through a reticle and a focusing lens to form a predetermined image pattern on the photoresist mask. The photoresist mask is developed and irradiated portions are removed to form openings in the mask. An anisotropic dry etch etches the polysilicon layer to form the polysilicon gates 104 and 108 with substantially vertical side walls using an etching process that is highly selective of polysilicon. A reactive ion etch (RIE) removes the regions of gate oxide layer 102 except for portions underlying the polysilicon gates 104 and 108. The photoresist mask is stripped.

The polysilicon gate 104 of the P-channel transistor 106 overlies a region of N-doped substrate 112, such as an N-well. The polysilicon gate 108 of the N-channel transistor 110 overlies a region of P-doped substrate 114.

Figure 2B:
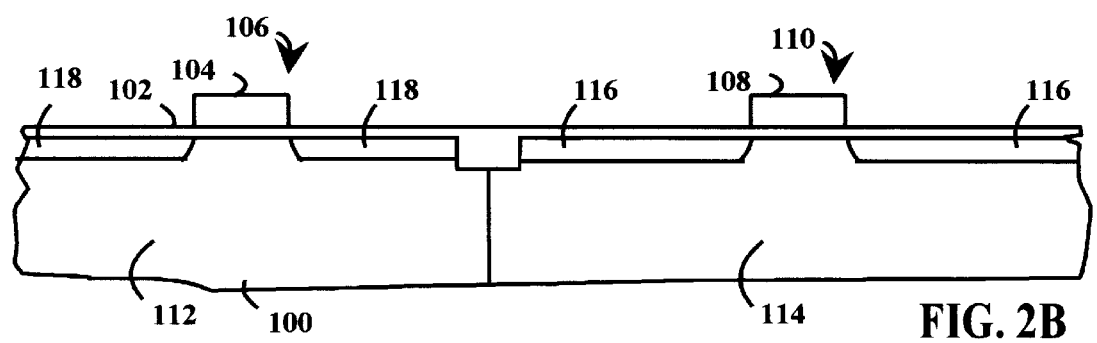

Referring to FIG. 2B, a first masking step and a first ion implant step form a N$^-$ LDD implant and include applying a lightly-doped drain (LDD) mask to the silicon wafer 100 and implanting N$^-$ ions to form N-channel transistor LDD regions 116 which are self-aligned with the polysilicon gate 108. The N$^-$ ion implantation process includes implanting arsenic at a dosage in the range of $1\times10^{13}$ to $5\times10^{14}$ atoms/cm$^2$ and an energy in the range of 2 to 50 keV, using the polysilicon gate 108 as an implant mask. A second masking step and a second ion implant step form a P$^-$ LDD implant and include applying a lightly-doped drain (LDD) mask to the silicon wafer 100 and implanting P$^-$ ions to form P-channel transistor LDD regions 118 which are self-aligned with the polysilicon gate 104. The P$^-$ ion implantation process includes implanting boron or BF$_2$ at a dosage in the range of $1\times10^{13}$ to $5\times10^{14}$ atoms/cm$^2$ and an energy in the range of 2 to 50 keV, using the polysilicon gate 104 as an implant mask. The implant energy for a boron implant is typically much lower than the implant energy for the BF$_2$ since boron atoms are very light and implant too deeply at high energies.

Figure 2C:
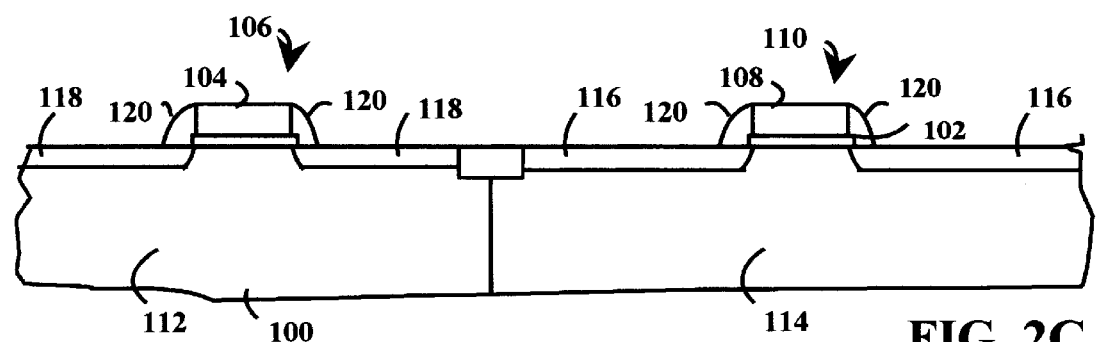

Referring to FIG. 2C, silicon nitride spacers 120 are formed on the substantially vertical side walls of the P-channel polysilicon gate 104 and the N-channel polysilicon gate 108. The silicon nitride spacers 120 are formed by chemical vapor deposition of a silicon nitride (Si$_3$N$_4$) film overlying the silicon wafer 100 and polysilicon gates 104 and 108. Silicon nitride films are amorphous insulating materials that serve as passivation and mechanical protective layers for integrated circuits. Silicon nitride films are suitable for usage as a passivation layer by acting as a nearly impervious barrier to diffusion, particularly diffusion of moisture and sodium.

A silicon nitride film is deposited using several techniques. In one technique, silicon nitride is deposited by high-temperature (700° C. to 800° C.) low pressure chemical vapor deposition (LPCVD) to produce a silicon nitride film with good uniformity. In a second technique, silicon nitride is deposited by a low temperature (200° C. to 400° C.) plasma-etched chemical vapor deposition (PECVD) that is compatible with low-melting-point metals such as aluminum. The silicon nitride layer is conformally deposited to a thickness in a range from 600 Å to 2000 Å and etched using a reactive ion etch (RIE) procedure that forms the silicon nitride spacers 120 adjacent to the edges of the polysilicon gates 104 and 108.

In the illustrative embodiment, the silicon nitride spacers 120 are formed directly in contact with the polysilicon gates 104 and 108 and directly in contact with the silicon wafer 100. In alternative embodiments, the silicon nitride spacers 120 may be formed separated from the polysilicon gates 104 and 108 by a thin oxide layer and separated from the silicon wafer 100 by a thin oxide layer.

The form of the P-channel transistor LDD regions 118 and the N-channel transistor LDD regions 116 determines the hot carrier performance of the transistors and is established by the profile of the silicon nitride spacers 120. The spacer profile varies as a function of the spacer nitride etch time and the spacer nitride thickness. A suitable amount of over-etch is used to form the silicon nitride spacers 120. However, excessive over-etching reduces the width and height of the silicon nitride spacers 120 and causes gouging into the silicon of the silicon wafer 100. Control of the over-etch process becomes more difficult as the deposited spacer nitride layer thickness increases.

In alternative embodiments, materials other than silicon nitride may be employed as spacers on the gate electrodes.

Advantages are gained by using a spacer material that is resistant to processes for etching a silicon dioxide (oxide) layer.

Figure 2D:
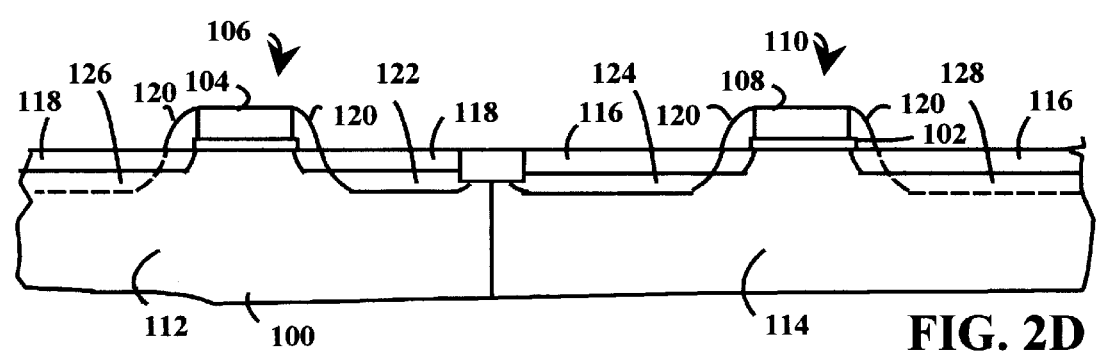

Referring to FIG. 2D, heavily doped drain regions including a P-channel drain region 122 and an N-channel drain region 124 are implanted into the silicon wafer 100 by applying separate mask and implant processes for the P-channel transistor 106 and the N-channel transistor 110. The heavily-doped P-channel drain region 122 is implanted by injecting boron atoms or $BF_2$ molecules into a portion of the surface of the silicon wafer 100 that is self-aligned with the polysilicon gate 104 and the silicon nitride spacer 120 on the drain side of the P-channel transistor 106. The boron atoms or $BF_2$ molecules are implanted at a dosage in the range of $1\times10^{15}$ to $5\times10^{15}$ atoms/cm$^2$ and an energy in the range of 10 KeV to 80 KeV to produce a boron or $BF_2$ concentration in the range of about $1\times10^{18}$ to $1\times10^{19}$ atoms/cm$^3$ and a junction depth in the range of 200 Å to 3000 Å. Generally, a typical source/drain P+ ion implant process is a shallow implant and therefore utilizes an implantation of $BF_2$ ions rather than boron ions. Boron ions are very light ions and a very low energy must be used to provide a shallow boron ion implant. If too high an energy is used, the light ions are implanted at too great a depth. However, when the implanting energy is low, the beam current is also too low so that the time taken to perform the implant is excessive. $BF_2$ ions are larger and heavier ions so that a higher energy implant achieves a shallow depth.

The heavily-doped N-channel drain region 124 is implanted by injecting arsenic atoms into a portion of the surface of the silicon wafer 100 that is self-aligned with the polysilicon gate 108 and the silicon nitride spacer 120 on the drain side of the N-channel transistor 110. The arsenic atoms are implanted at a dosage in the range of $1\times10^{15}$ to $5\times10^{15}$ atoms/cm$^2$ and an energy in the range of 2 to 50 keV to produce an arsenic concentration in the range of about $1\times10_{18}$ to $1\times10^{19}$ atoms/cm$^3$ and a junction depth in the range of 200 Å to 3000 Å.

The junction depth of the P-channel drain region 122 and the N-channel drain region 124 is deeper than the depth of respective P-channel transistor LDD regions 118 and N-channel transistor LDD regions 116. The dopant concentration of the P-channel drain region 122 and the N-channel drain region 124 are sufficiently large to attain a conductive state of the respective P-channel polysilicon gate 104 and N-channel polysilicon gate 108 when connected to a suitably doped source.

The silicon wafer 100 is annealed to remove crystalline damage and activate and drive-in the implanted arsenic using a rapid thermal anneal process at a temperature in a range from 950° C. to 1050° C. for 10 to 60 seconds. The implanted boron or $BF_2$ in the silicon wafer 100 diffuses laterally and vertically, merging the P-channel drain region 122 with the P-channel transistor LDD region 118 in the vicinity of the P-channel drain region 122. The implanted arsenic in the silicon wafer 100 diffuses laterally and vertically to merge the N-channel drain region 124 with the N-channel transistor LDD regions 116 in the vicinity of the N-channel drain region 124.

Following implanting of the P-channel drain region 122 and the N-channel drain region 124, the P-channel transistor 106 has a P-channel source region 126 that is not doped. The N-channel transistor 110 has an N-channel source region 128 that is not doped. Thus, the illustrative semiconductor structure, in contrast to conventional LDD structures, has no implant dopant in source regions except for LDD doping.

In some method embodiments, special processing is performed only on the source side of a transistor to achieve a shallower junction on the source side alone. The remainder of the process flow advantageously may be a conventional process flow with conventional formation of the drain.

Figure 2E:
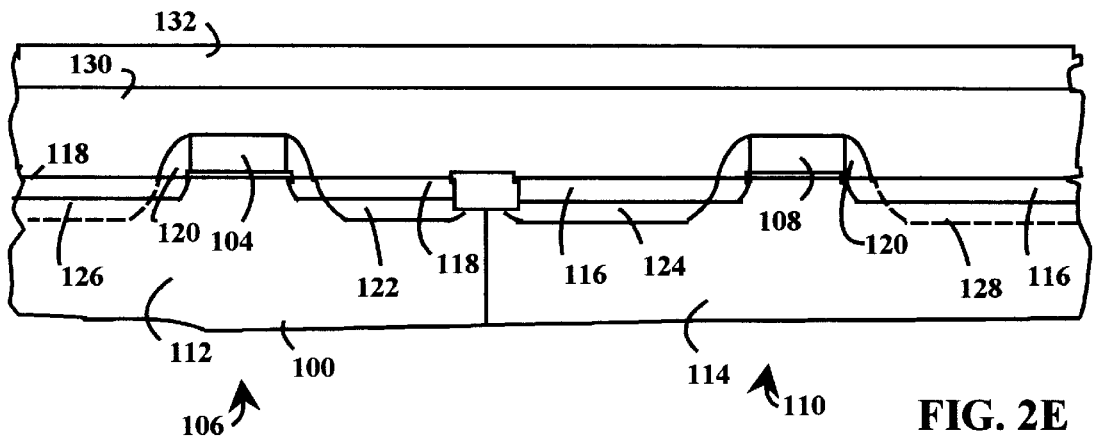

Referring to FIG. 2E, a blanket layer of silicon oxide ($SiO_2$) 130 is formed over the silicon wafer 100, covering the polysilicon gate 104 and silicon nitride spacers 120 of the P-channel transistor 106 and the polysilicon gate 108 and silicon nitride spacers 120 of the N-channel transistor 110. The oxide layer 130 with a thickness in the range of 5000 Å to 20000 Å is conformally deposited over the silicon wafer 100 by chemical vapor deposition (CVD) at a temperature in the range of 300° C. to 400° C.

A blanket layer of polysilicon 132 is deposited over the silicon wafer 100, covering the oxide layer 130. The polysilicon layer 132 is deposited by low pressure chemical vapor deposition (LPCVD) on the top surface of the oxide layer 130 to a thickness of approximately 2000 Å. The polysilicon layer 132 is doped to form an electrical conductor. In one example, the polysilicon layer 132 is implanted with arsenic with a dosage in the range of $1\times10^{15}$ to $5\times10^{15}$ atoms/cm$^2$ and an energy in the range of 2 to 50 kiloelectron-volts. In some embodiments, the polysilicon layer 132 is heavily doped to supply an improved conductance.

The polysilicon layer 132 is made conductive by annealing the silicon wafer 100 to activate and drive-in the dopant implanted in the polysilicon layer 132 using a rapid thermal anneal process at a temperature in a range from 950° C. to 1050° C. for 10 to 60 seconds.

In some embodiments, a metal is deposited adjacent to the polysilicon layer 132 and reacts with the exposed silicon to form a silicide. The silicidation of the polysilicon layer 132 advantageously enhances the conductive properties of the polysilicon. The silicidation process in combination with an anneal process substantially enhances the conduction properties of the upper 200 Å of the polysilicon layer 132. Prior to the silicidation process, the silicided polysilicon layer 132 is polished using a chemical-mechanical polishing process.

Figure 2F:
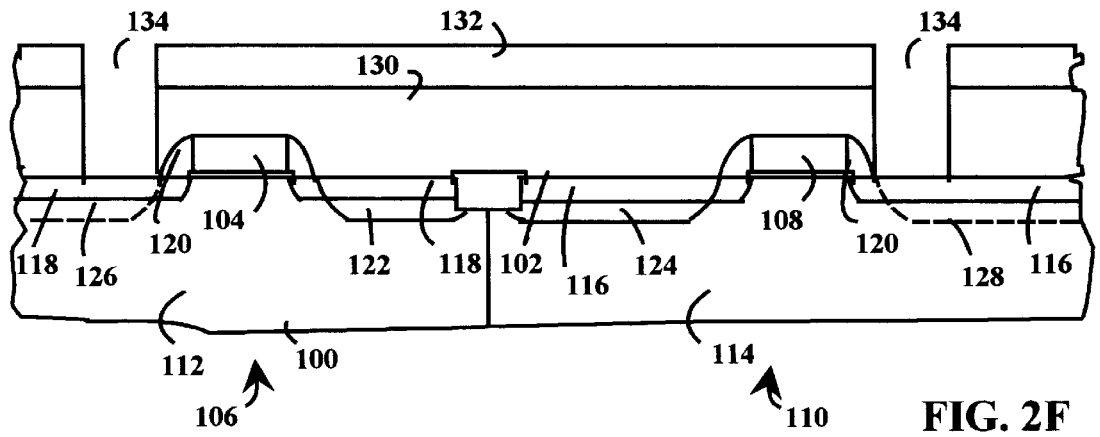

Referring to FIG. 2F, a source-defining photoresist mask is patterned over the polysilicon layer 132. The source-defining photoresist mask is deposited in a continuous layer on the polysilicon layer 132 and irradiated using the photolithographic system to form a predefined two-dimensional image pattern on the horizontal planar surface of the polysilicon layer 132. The source-defining photoresist mask defines a plurality of source vias 134 for accessing the surface of the silicon wafer 100 adjacent to selected source regions such as the P-channel source region 126 and the N-channel source region 128 from the polysilicon layer 132. The source-defining photoresist mask is developed and irradiated portions of the mask are removed to expose the polysilicon layer 132 overlying the prospective locations of the source vias 134. An anisotropic dry etch that is highly selective of polysilicon cuts the source vias 134 through the polysilicon layer 132. The oxide layer 130 is etched using a reactive ion etch (RIE) that etches the source vias 134 to the surface of the silicon wafer 100. The reactive ion etch (REF) selectively etches the oxide layer 130 but does not etch the silicon nitride spacers 120 so that the silicon nitride spacers 120 protect against etching too close to the polysilicon gates 104 and 108. Thus, some inaccuracy is advantageously tolerated in the positioning of the source-defining photoresist mask.

Usage of nitride spacers is advantageous because nitride is resistant to the reactive ion etch (RIE) process for etching the oxide layer 130. Accordingly, the nitride spacers protect the edge of the MOSFET so that the source-defining photoresist mask may be patterned at the edge of the nitride spacers or overlapping the nitride spacers. This characteristic simplfies and reduces the cost of fabrication processes since the sensitivity of the process to photolithographic system alignment is reduced. Materials other than polysilicon may be used for the spacers although the described advantages are gained for materials that are resistant to etching of the oxide layer.

Following formation of the source vias 134, the source-defining photoresist mask is stripped, exposing the P-channel source region 126 and N-channel source region 128 of the silicon wafer 100.

In some embodiments, silicidation is performed on the etched portions of the polysilicon layer 132 adjacent to the source vias 134 to that a strong silicide is formed not only on the top of the polysilicon layer 132 but in the polysilicon layer 132 along the source vias 134, substantially enhancing the conduction properties of the 200 Å of the polysilicon layer 132 bounding the source vias 134.

Figure 2G:
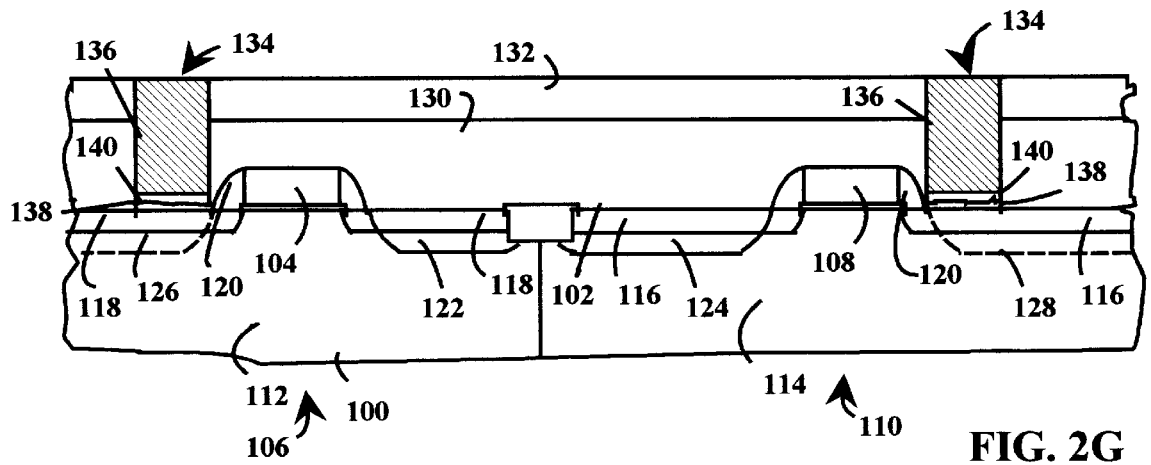

Referring to FIG. 2G, source regions are supplied in the individual transistors such as the P-channel transistor 106 and the N-channel transistor 110 in the form of metal plugs 136 formed in the source vias 134. Accordingly, the source regions are formed on the surface of the silicon wafer 100 and not within the substrate as in conventional transistors. The metal plugs 136 form an electrical connection with the doped LDD regions in the vicinity of the N-channel source region 128 and the P-channel source region 126. The metal plugs 136 form a connection with the LDD regions with the metal serving as a conductor and source of electrons.

The source region formed by the metal plug 136 attains the ultimate in shallowness of the source drain junction, a position at the surface of the substrate. A source in the form of a metal plug 136 on the surface of the silicon wafer 100 advantageously supplies a source of electrons that is vastly superior to a conventional doped semiconductor substrate. A source in the form of a metal plug 136 eliminates the heavily doped source/drain diffusion into the silicon substrate that degrades transistor performance in conventional MOSFETs. A source in the form of a metal plug supplies a large concentration of electrons at the surface and a very shallow depth in the substrate. Usage of the metal plugs 136 as a source supplies the advantages of a shallower junction, a shorter junction, a heavy source of electrons and excellent conduction properties.

The metal plugs 136, in addition to serving as a source region for a MOSFET, are connected to the conductive polysilicon layer 132 to form a connection to an interconnect structure selectively connecting multiple transistors. The connection of the metal plugs 136 to the polysilicon layer 132 not only serves to connect individual MOSFETs within an integrated circuit but also operates to widen the source of the MOSFETs, supplying an additional electron source. Accordingly, the electron source is not constrained to the plug within a contact via but also extends to the overlying polysilicon layer 132 that may be highly doped to supply additional electrons, advantageously achieving a higher conductivity and a lower resistance. The electron source supplied by the polysilicon layer 132 is advantageous as transistor geometries are reduced in scale, the size of the contact vias and metal plugs is also decreased.

The metal plugs 136 are formed by first depositing a titanium sacrificial barrier 138 into the source vias 134 in contact with the source regions of the silicon wafer 100. Titanium films are used as a diffusion barrier since titanium (Ti) is an oxygen-gettering material and oxide-reducing agent. Accordingly, titanium dissolves a native oxide layer on the silicon surface of the silicon wafer 100 during annealing and adheres well to both silicon and oxide ($SiO_2$). In addition, titanium forms good ohmic contacts to heavily-doped silicon whether the doping is N-type doping or P-type doping.

The illustrative structure advantageously facilitates circuit arrangements in which the sources of two or more transistors are connected.

In the illustrative embodiment, the metal plugs 136 form a tungsten (W) interconnect. The titanium sacrifcial barrier 138 between the polysilicon of the source regions of the silicon wafer 100 and the tungsten metal plugs 136 functions as a sacrificial barrier through the rection of titanium with tungsten to form a titanium-tungsten alloy. The titanium sacrificial barrier 138 is formed by depositing a very thin layer of titanium onto the silicon wafer 100 including deposition into the source vias 134. The silicon wafer 100 is annealed to react the titanium with the silicon in the undoped polysilicon, thereby forming $TiSi_2$. The titanium is deposited as a very thin layer to avoid absorption of dopants from the undoped polysilicon 132 during formation of $TiSi_2$.

Following the formation of the titanium sacrificial barrier 138, a titanium nitride (TiN) passive barrier 140 is formed over the titanium sacrificial barrier 138. The TiN passive barrier 140 serves as a contact diffusion barrier in silicon integrated circuits by operating as an impermeable barrier to silicon and by virtue of a high activation energy for the diffusion of other impurities. TiN has a high thermodynamic stability and a relatively low electrical resistivity of transition metal carbides, borides or nitrides. The TiN passive barrier 140 is formed using one of multiple techniques. For example, the TiN passive barrier 140 is formed by: (1) evaporating titanium in a nitrogen ($N_2$) ambient, (2) reactively sputtering the titanium in an argon (Ar)—nitrogen ($N_2$) mixture, (3) sputtering from a TiN target in an inert argon ambient, (4) sputter depositing titanium in an argon (Ar) ambient and converting the titanium to TiN is a separate plasma nitridation step, or (5) chemical vapor deposition (CVD).

The tungsten metal plugs 136 are formed by chemical vapor deposition (CVD) of tungsten in a low pressure CVD reactor. Typically tungsten tetrafluoride $WF_6$ is used as a source gas for reduction by hydrogen or silicon in a two-step process. In a first step, the tungsten source is reduced by silicon to form a layer of tungsten approximately 100 Å thick. In a second step, hydrogen $H_2$ reduction is performed to deposit additional tungsten only on the tungsten layer formed in the first step. The metal plugs 136 are formed in the source vias 134 over the titanium sacrificial barrier 138 and the TiN passive barrier 140 by silicon reduction of tungsten tetrafluoride $WF_6$, leaving solid tungsten and silicon fluoride vapor.

Once the metal plugs 136 are formed, chemical-mechanical polishing (CMP) is used to planarize the surface of the silicon wafer 100. CMP creates a smooth, planar surface for intermediate processing steps of an integrated circuit fabrication process and removes undesirable residues that remain from other substrate processing steps. CMP involves simultaneous chemically etching and mechanical polishing or grinding of a surface so that a combined chemical reaction and mechanical polishing removes a desired material from the substrate surface in a controlled manner. The resulting structure is a planarized substrate surface with any protruding surface topography leveled. CMP is typically performed by polishing a substrate surface against a polishing pad that is wetted with a slurry including an acidic or basic solution, an abrasive agent and a suspension fluid.

The metal plugs 136 may be formed of metals other than tungsten. Tungsten advantageously tolerates high temperatures that occur during annealing.

Figure 3:
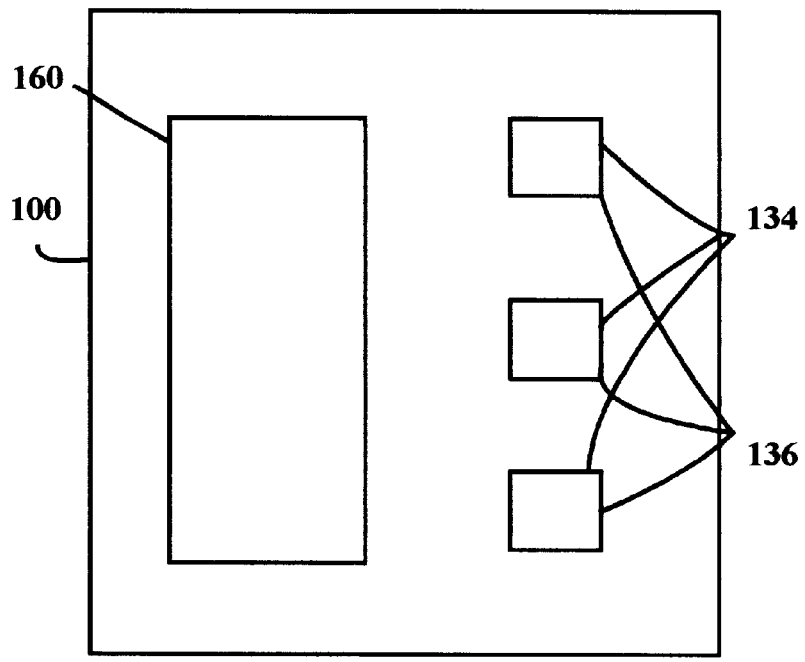
FIG. 3 depicts a top view of an embodiment of an integrated circuit including a detached source.

Referring to FIG. 3, a top view of an integrated circuit including a detached source illustrates an embodiment in which a plurality of contact source vias 134 are etched and filled with a plurality of metal plugs 136 to supply a source on the surface of a silicon wafer 100 for a transistor 160.

Figure 4:
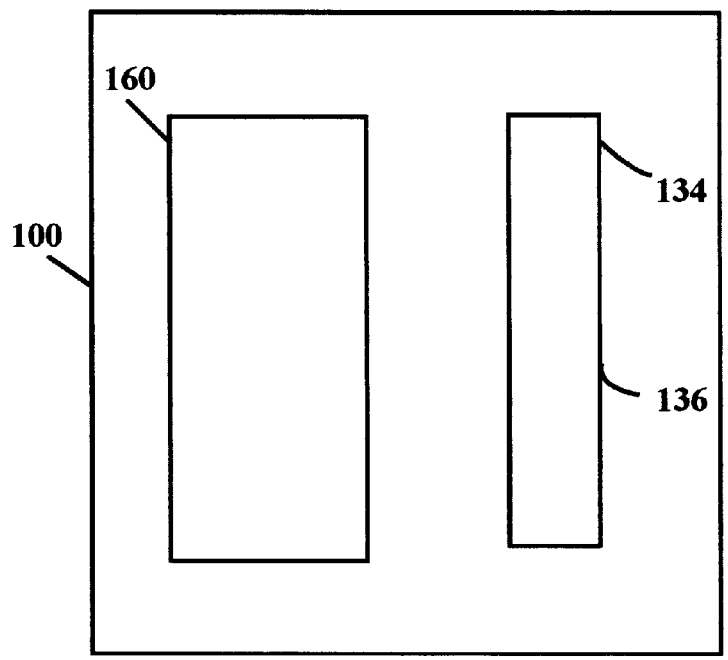
FIG. 4 depicts a top view of an additional embodiment of an integrated circuit including a detached source.

Referring to FIG. 4, a top view of an integrated circuit including a detached source illustrates an additional embodiment in which a single contact source via 134 is etched and filled with a metal plug 136 to supply a source on the surface of a silicon wafer 100 for a transistor 162.

Figure 5:
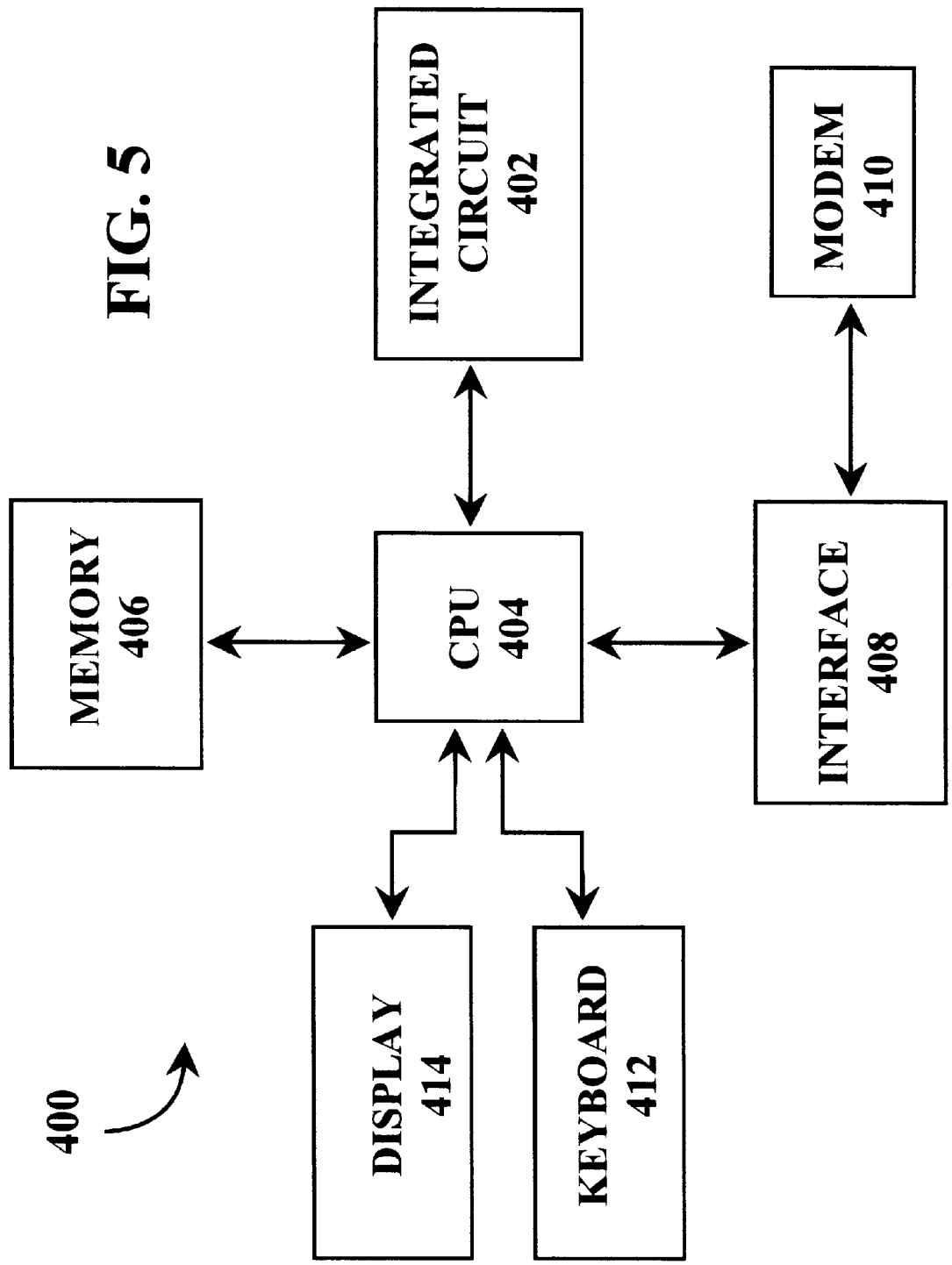
FIG. 5 is a schematic block diagram illustrating a computer system including an integrated circuit including vertical transistors with spacer gates fabricated using a method as depicted in FIGS. 2A through 2G.

Referring to FIG. 5, a computer system 400 includes an integrated circuit 402, a central processing unit 404, a memory 406, and an interface 408, connected to a modem 410. The computer system 400 also includes a keyboard 412 and a display 414 forming a user interface.

While the invention has been described with reference to various embodiments, it will be understood that these embodiments are illustrative and that the scope of the invention is not limited to them. Many variations, modifications, additions and improvements of the embodiments described are possible. For example, those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of fabricating an integrated circuit comprising:
    forming a lightly-doped drain (LDD) MOSFET structure including a gate formed on a substrate over a gate oxide layer, spacers formed on sides of the gate, LDD doping of the substrate in a source region and a drain region self-aligned with the gate, and drain doping in the drain region, the LDD doping and drain doping being self-aligned with the gate and spacers, the source region being left undoped other than the LDD source region doping;
    forming an oxide layer over the substrate and LDD MOSFET structure;
    forming a polysilicon layer over the oxide layer;
    cutting a via through the polysilicon layer and source layer to the substrate surface adjacent to the gate and spacer and abutting the source region of the substrate; and
    forming a metal plug in the via, the metal plug electrically coupling to the LDD doping in the source region of the substrate and electrically coupling to the polysilicon layer, the metal plug supplying electrons as a source for the MOSFET.

2. A method according to claim 1, further comprising:
    forming the spacers from a material that is resistant to oxide etching.

3. A method according to claim 1, further comprising:
    forming the spacers from a silicon nitride material that is resistant to oxide etching.

4. A method according to claim 1, further comprising:
    doping the polysilicon layer to improve the conductance and reduce the resistance of the polysilicon layer.

5. A method according to claim 1, further comprising:
    siliciding the surface of the polysilicon layer to improve the conductance and reduce the resistance of the polysilicon layer.

6. A method according to claim 1, further comprising:
    siliciding the surfaces of the polysilicon layer formed by cutting the via through the polysilicon layer to improve the conductance and reduce the resistance of the polysilicon layer.

7. A method according to claim 1, further comprising:
    forming the metal plug in the via from a metal having a relatively high melting point.

8. A method according to claim 1, further comprising:
    forming the metal plug in the via from a tungsten-based metal having a relatively high melting point.

9. A method of fabricating an integrated circuit comprising:
    forming a thin gate oxide layer on a substrate;
    forming a gate on the gate oxide layer;
    doping a lightly-doped drain (LDD) region of the substrate on the surface of the substrate and self-aligned with the gate, the LDD region including a LDD source region doping and an LDD drain region doping;
    forming spacers on sides of the gate;
    doping a heavily-doped drain region of the substrate on the surface of the substrate and extending deeper than the LDD region on a drain side of the gate, self-aligned with the gate and spacer, the source region being left undoped other than the LDD source region doping;
    forming an oxide layer over the substrate, the spacers, and the gate;
    forming a polysilicon layer over the oxide layer;
    cutting a via through the polysilicon layer and source layer to the substrate surface adjacent to the gate and spacer and abutting a source region of the substrate on a source side of the gate; and
    forming a metal plug in the via, the metal plug electrically coupling to the LDD doping in the source region of the substrate and electrically coupling to the polysilicon layer, the metal plug supplying electrons as a heavily-doped source region.

10. A method according to claim 9, further comprising:
    forming the spacers from a material that is resistant to oxide etching.

11. A method according to claim 9, further comprising:
    forming the spacers from a silicon nitride material that is resistant to oxide etching.

12. A method according to claim 9, further comprising:
    doping the polysilicon layer to improve the conductance and reduce the resistance of the polysilicon layer.

13. A method according to claim 9, further comprising:
    siliciding the surface of the polysilicon layer to improve the conductance and reduce the resistance of the polysilicon layer.

14. A method according to claim 9, further comprising:
    siliciding the surfaces of the polysilicon layer formed by cutting the via through the polysilicon layer to improve the conductance and reduce the resistance of the polysilicon layer.

15. A method according to claim 9, further comprising:

forming the metal plug in the via from a metal having a relatively high melting point.

16. A method according to claim 9, further comprising:

forming the metal plug in the via from a tungsten-based metal having a relatively high melting point.

17. A method of fabricating an integrated circuit device comprising:

forming a lightly-doped drain (LDD) device structure including a gate formed on a substrate over a gate oxide layer, spacers formed on sides of the gate, LDD doping of the substrate in a source region and a drain region self-aligned with the gate, and drain doping in the drain region, the source region being left undoped other than the LDD source region doping;

forming an oxide layer over the substrate and LDD device structure;

forming a polysilicon layer over the oxide layer;

cutting a via through the polysilicon layer and source layer to the substrate surface adjacent to the gate and spacer and abutting the source region of the substrate; and forming a metal plug in the via, the metal plug electrically coupling to the LDD doping in the source region of the substrate and electrically coupling to the polysilicon layer, the metal plug supplying electrons as a source for the integrated circuit device.

18. A method according to claim 17, further comprising:

forming the spacers from a material that is resistant to oxide etching.

19. A method according to claim 17, further comprising:

forming the spacers from a silicon nitride material that is resistant to oxide etching.

20. A method according to claim 17, further comprising:

doping the polysilicon layer to improve the conductance and reduce the resistance of the polysilicon layer.

21. A method according to claim 17, further comprising:

siliciding the surface of the polysilicon layer to improve the conductance and reduce the resistance of the polysilicon layer.

22. A method according to claim 17, further comprising:

siliciding the surfaces of the polysilicon layer formed by cutting the via through the polysilicon layer to improve the conductance and reduce the resistance of the polysilicon layer.

23. A method according to claim 17, further comprising:

forming the metal plug in the via from a metal having a relatively high melting point.

24. A method according to claim 17, further comprising:

forming the metal plug in the via from a tungsten-based metal having a relatively high melting point.

* * * * *